United States Patent [19] [11] Patent Number: 5,393,701
Ko et al. [45] Date of Patent: Feb. 28, 1995

[54] LAYOUT DESIGN TO ELIMINATE PROCESS ANTENNA EFFECT

[75] Inventors: Joe Ko; Bill Hsu, both of Hsinchu, Taiwan, Prov. of China

[73] Assignee: United Microelectronics Corporation, Hsinchu, Taiwan, Prov. of China

[21] Appl. No.: 44,931

[22] Filed: Apr. 8, 1993

[51] Int. Cl.$^6$ .......................................... H01L 21/443
[52] U.S. Cl. ................................... 437/193; 437/923; 437/195; 437/228
[58] Field of Search .................. 437/193, 195, 51, 186, 437/923, 228

[56] References Cited

U.S. PATENT DOCUMENTS

| | | | |
|---|---|---|---|
| 4,900,695 | 2/1990 | Takahashi | 437/195 |
| 5,049,525 | 9/1991 | Coleman, Jr. | 437/195 |
| 5,055,425 | 10/1991 | Leibovitz et al. | 437/195 |
| 5,059,554 | 10/1991 | Spinner | 437/193 |
| 5,106,461 | 4/1992 | Volfson et al. | 205/125 |
| 5,139,963 | 8/1992 | Suzaki et al. | 437/51 |
| 5,212,400 | 5/1993 | Joshi | 257/412 |
| 5,219,791 | 6/1993 | Freiberger | 437/195 |

OTHER PUBLICATIONS

Shone et al., "Gate Oxide Charging and its Elimination for Metal Antenna Capacitor and Transistor in VLSI CMOS Double Layer Metal Technology", Symposium on VCSI Technology, pp. 73–74, Jun. 1988.

Primary Examiner—Olik Chaudhuri
Assistant Examiner—Richard A. Booth
Attorney, Agent, or Firm—George D. Salle; Stephen B. Ackerman

[57] ABSTRACT

A multi-level conductive interconnection for an integrated circuit is formed in a silicon substrate, wherein there are large contact pad areas at the periphery of the interconnection. A patterned layer of a conductive polysilicon is formed on the substrate to act as a first conductive contact to the integrated circuit. An insulating layer is formed over the polysilicon layer, and openings to the polysilicon layer are formed through the insulating layer. A first layer of metal is formed on the insulator such that the metal electrically connects to the polysilicon through the openings, and also forming large contact pad areas. The first metal is patterned to form an electrical break between the large contact pad areas and the integrated circuit. This break prevents electrical damage to the integrated circuit due to charge build-up during subsequent processing in a plasma environment. A second insulating layer is formed and patterned to provide openings for vias to the first metal layer. A second layer of metal is formed over the large contact pad area and over the electrical break such that the second metal electrically connects to the first metal, via direct contact to the first metal at the large contact pad area, and through the openings in the second insulator to the first metal interconnection. Finally, a passivation layer is formed over the second metal layer.

11 Claims, 5 Drawing Sheets

LAYOUT DESIGN TO ELIMINATE PROCESS ANTENNA EFFECT

BACKGROUND OF THE INVENTION (1) Field of the Invention

The invention relates to the manufacture of highly dense integrated circuits and more particularly to the reduction and elimination of electrostatic charge buildup at the device during manufacture in, for example, plasma etching or the like process steps.

(2) Description of the Prior Art

In the manufacture of highly dense integrated circuits using Metal Oxide Semiconductor (MOS) technology with multiple metal layers, electrical charge may build up at the device gate oxide during plasma processing. The charge accumulates on floating polysilicon and metal layers electrically connected to the gate oxide. Interconnection metal lines act as "antennas", amplifying the charging effect and leading to trapped charges at the gate oxide. These trapped charges can cause yield loss and reliability failures.

Workers in the field have verified this problem experimentally. Shone et al in "Gate Oxide Charging and Its Elimination for Metal Antenna Capacitor and Transistor in VLSI CMOS Double Layer Metal Technology" (published in "Symposium on VLSI Technology, pp. 73-74 in Jun., 1988) verified the antenna effect experimentally. They found that the double metal layer technologies worsened the effect by the ratio of the antenna area to the gate oxide area. The worst degradation of gate oxide occurred during oxynitride deposition, however other plasma processing is also believed to lead to trapped charges at the gate oxide.

SUMMARY OF THE INVENTION

It is a principal object of this invention to provide a method for eliminating the antenna effect of accumulated electrical charge on floating polysilicon and metal interconnections connected to the gate oxide, without additional process steps. This is accomplished by isolating the polysilicon and metal interconnections from the gate oxide during plasma processing.

This object is achieved by forming a multi-level conductive interconnection for an integrated circuit in a silicon substrate, wherein there are large contact pad areas at the periphery of the interconnection. A patterned layer of a conductive polysilicon is formed on the substrate to act as a first conductive contact to the integrated circuit. An insulating layer is formed over the polysilicon layer, and openings to the polysilicon layer are formed through the insulating layer. A first layer of metal is formed on the insulator such that the metal electrically connects to the polysilicon through the openings. The large contact pad areas are formed with the first layer of metal. The first metal is patterned to form an electrical break in the first metal interconnection, between the large contact pad areas and the integrated circuit. This break prevents electrical damage to the integrated circuit due to charge build-up during subsequent processing in a plasma environment. A second insulating layer is formed and patterned to provide openings for vias to the first metal layer. A second layer of metal is formed over the large contact pad area and over the electrical break such that the second metal electrically connects to the first metal, via direct contact to the first metal at the large contact pad area, and through the openings in the second insulator to the first metal interconnection. Finally, a passivation layer is formed over the second metal layer.

A third metal layer could be added to the structure and damage due to charge build-up prevented by patterning an electrical break in the second metal layer at the same location as the electrical break in the first metal layer, and then connecting the contact pad area and device with the third metal layer. Additional metal layers could be added in a similar way.

It is a further object of this invention to provide a method that will reduce the charge that may accumulate at the gate oxide by reducing the size of the contact pad area during plasma processing.

This object is achieved by forming a first metal layer, much smaller in area than the large contact pad area, under one edge of the contact pad area. This small area reduces electrical charge build-up at the gate oxide of the device during subsequent processing in a plasma environment compared to that which would build up if the first metal layer comprised the entire contact pad area. An insulating layer is formed over the first metal layer, and openings to the first metal layer are formed through the insulating layer. The large contact pad is formed with a second layer of metal, and is connected to the first metal layer through the openings in the insulating layer. A passivation layer is then formed over the contact pad.

A third metal layer could be added to the contact pad area and damage due to charge build-up reduced by forming the second metal layer to be the same size as the first metal layer, and forming the large contact pad with the third metal layer, and connecting all three layers through intermediate insulating layers. Additional metal layers could be formed in a similar way.

DESCRIPTION OF THE PREFERRED EMBODIMENTS

Figure 1:
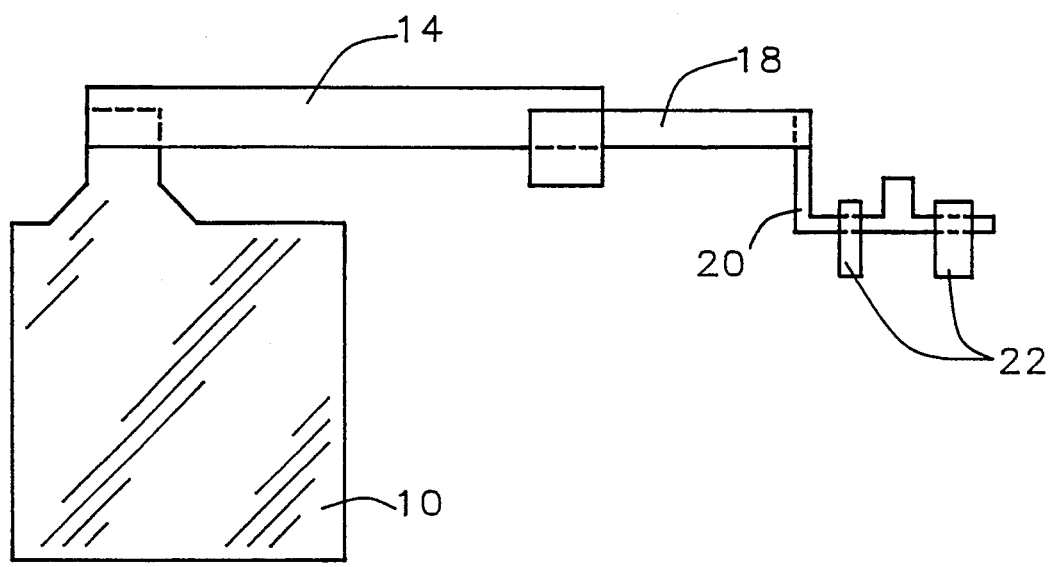
FIG. 1 illustrates a schematic diagram of the Prior Art process for connecting a large contact pad with an active MOS device using one level of metal, which could lead to device damage due to the antenna effect.

Referring now to FIG. 1, there is shown a schematic diagram to demonstrate the problem found in prior art devices. As can be seen in FIG. 1, in the manufacture of MOS semiconductor devices, a large contact pad area 10 (of typical size 100 by 100 micrometers, and more than about 30 by 30 micrometers) is electrically connected by vias to a polysilicon interconnection 14. The pad area 10 in a double metal process would consist of the two layers of metal. The polysilicon interconnection 14 is connected by vias through an insulating layer to metal interconnection 18. This metal interconnection 18 is connected by vias to polysilicon 20 and then to active devices 22. There is a direct electrical connection among all elements, and charge accumulated during plasma processing on the polysilicon and large metal areas can lead to damage to the devices due to trapped charges.

It is common in the manufacture of integrated circuits today to use plasmas, with two of the most common processes being reactive plasma etching, and plasma enhanced chemical vapor deposition. A plasma is a collection of charged particles, including electrons and positive and negative ions, and it is these charged particles that collect along the conductive surfaces during plasma processing and may produce the trapped charges damaging the gate oxide.

Figure 2A:
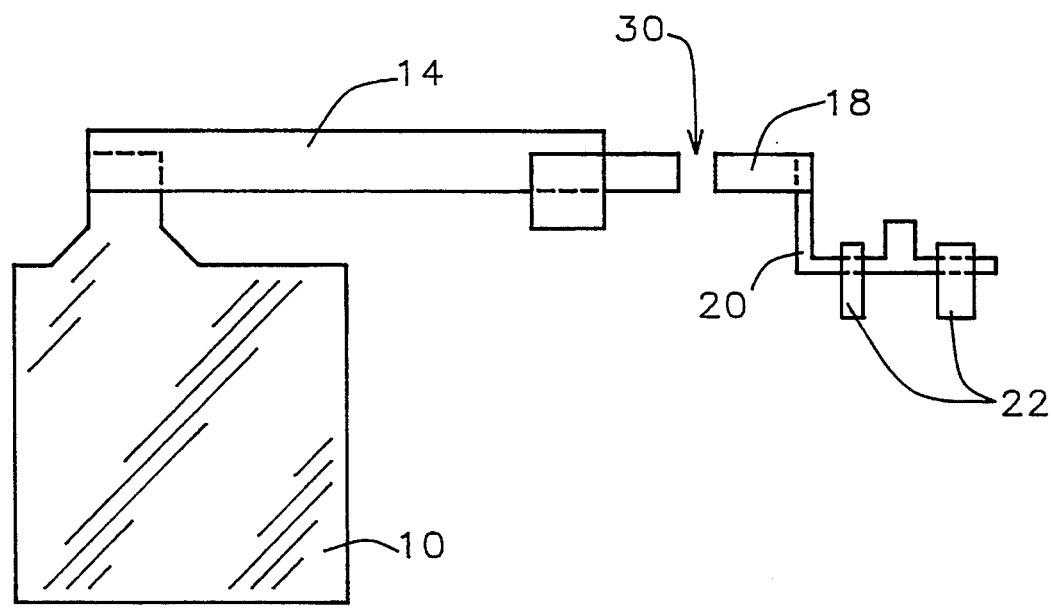
FIGS. 2a through 2c illustrate the process of the present invention for eliminating the antenna effect in a double metal structure using an electrical break in the first metal layer.

Referring now to FIG. 2a, there is shown the preferred embodiment of the present invention. After metal I has been deposited in areas 10 and 18, an electrical break 30 is patterned in the metal I interconnection. Any charge accumulated during subsequent plasma processing steps on the pad side of electrical break 30, particularly on the large pad area, will not affect the devices 22.

Figure 2B:
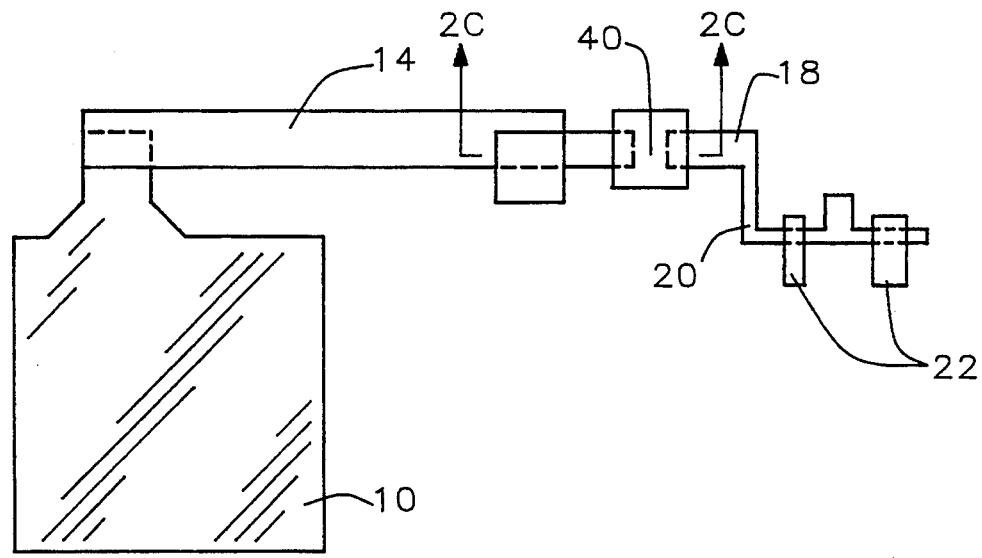

Referring now to FIG. 2b, a second metal layer has been added to area 10, and to form connection 40 to close the electrical break. This is done by a small mask change in the metal II mask used for lithography and etching and patterning of the metal II layer. The second metal layer connection 40 is connected through an insulating layer and vias to re-establish the electrical connection between the large pad area 10 and devices 22, after plasma processing has completed.

Figure 2C:
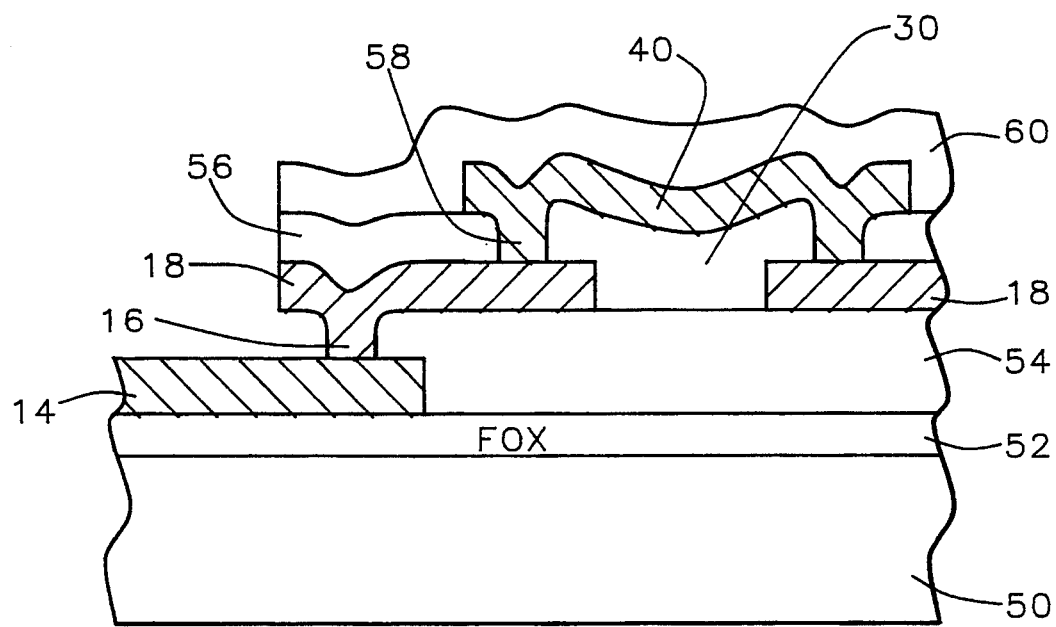

Referring now to FIG. 2c, there is shown a cross-sectional representation of the electrical break and re-connection. Field oxide 52 is thermally grown on substrate 50, and polysilicon 14 is deposited and patterned on the field oxide. Via 16 is opened though insulating layer 54, typically by full dry or wet by dry etching, and the first metal layer 18 deposited such that it connects through via 16 to polysilicon 14. Electrical break 30 is then patterned by conventional lithography and etching in the first metal layer 18 to break the connection between the pad area and devices. Subsequent plasma processing steps may now be completed without accumulating charge and causing the antenna effect. Via 58 is patterned through insulating layer 56, and the second metal layer 40 deposited and patterned to re-connect the first metal layer 18 and re-establish the electrical connection from pad to devices. Finally, a passivation layer 60 is deposited on the second layer metal.

Figure 3A:
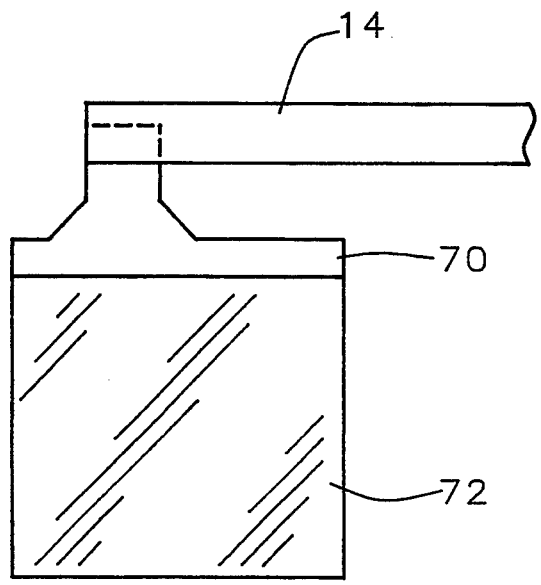
FIGS. 3a through 3c illustrate a further embodiment of the present invention in a double metal structure which reduces the antenna effect by using a much reduced contact pad area for the first metal layer.

Referring now to FIG. 3a, there is shown a further embodiment of the present invention. First metal layer 70 is deposited and patterned by conventional lithography and etching to cover a much smaller area than the eventual large contact pad area 72. The actual typical dimension of the much smaller area is about 6×100 micrometers, whereas the dimension of the larger contact pad area is between about 80×80 and 200×200 micrometers. The reduced area of metal I will lessen any charge accumulated during subsequent plasma processing. As in the first embodiment, the first metal layer is connected to polysilicon interconnection 14 through vias.

Figure 3B:
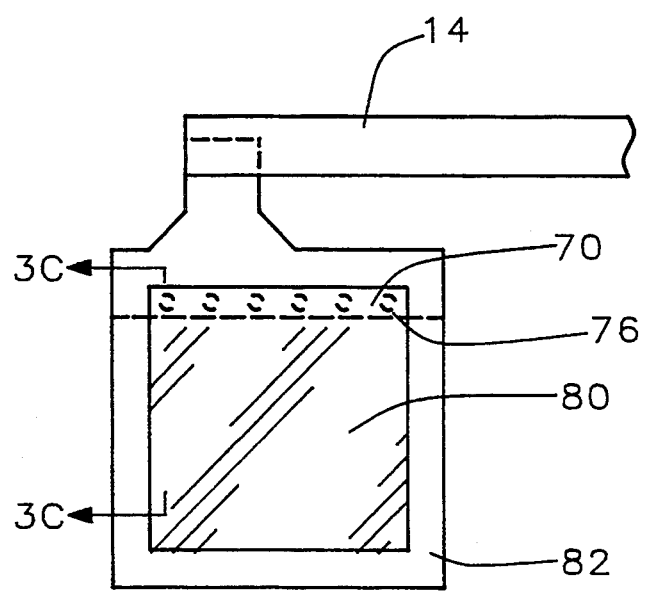

Referring now to FIG. 3b, second metal layer 80 is formed and connected to metal layer 70 through small size via 76, in order to reduce the sputter etch damage before metal II sputtering. The via size is about 2×2 micrometers. Passivation layer 82 is formed on top of second metal layer 80, around the perimeter of the contact pad.

Figure 3C:
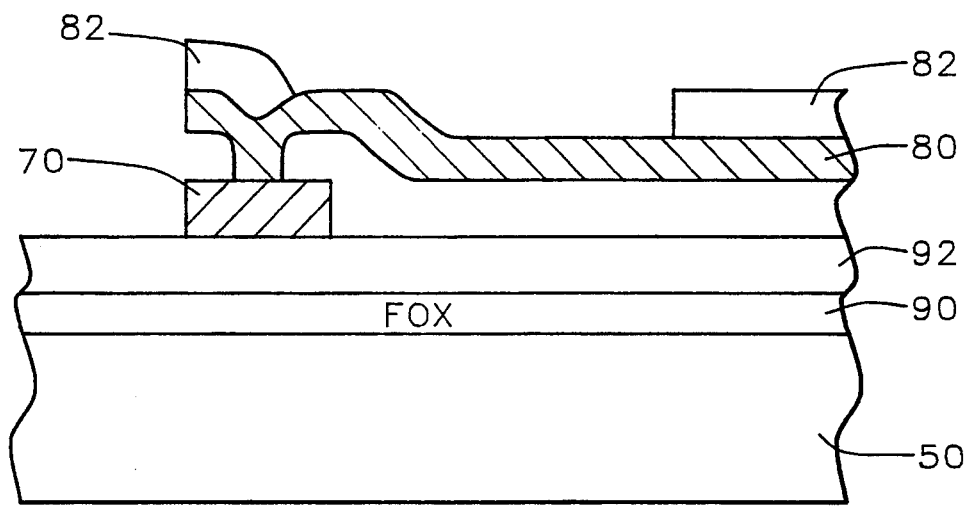

Referring now to FIG. 3c, there is shown a cross-sectional representation of the embodiment shown in FIG. 3b. Field oxide 90 is thermally grown on substrate 50, and borophosphosilicate glass (BPSG) insulating layer 92 deposited on FOX 90. First metal layer 70 is deposited and patterned to be a much reduced area compared to the large contact pad area. This smaller area minimizes charge accumulation during subsequent plasma processing steps. Second metal layer 80 is deposited and connected to first metal layer 70, and comprises the complete and much larger pad area than metal I. Passivation layer 82 is deposited above second metal layer 80.

Figure 4:
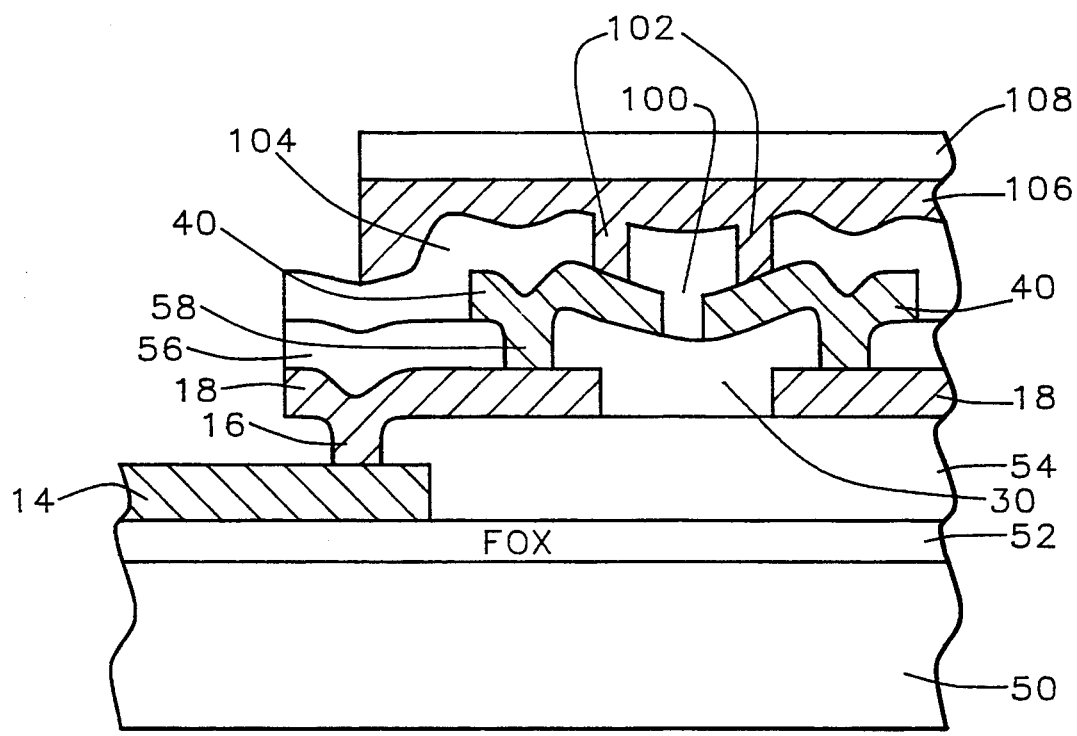
FIGS. 4 and 5 illustrate further embodiments of the present invention, for a triple metal structure.

Referring now to FIG. 4, there is shown a cross-sectional representation of an electrical break in two levels of metal for a three-level metal technology. Field oxide 52 is thermally grown on substrate 50, and polysilicon 14 patterned by conventional lithography and etching on the field oxide. Via 16 is patterned by lithography and etching though insulating layer 54, and first metal layer 18 is deposited and patterned by conventional lithography and etching such that it connects through via 16 to polysilicon 14. Electrical break 30 is patterned in the first metal layer 18 to break the connection between the pad area and devices. Subsequent plasma processing steps may now be completed without accumulating charge and causing the antenna effect. Via 58 is patterned through insulating layer 56, and the second metal layer 40 deposited. Electrical break 100 is patterned by lithography and etching in the second metal layer 40 to maintain isolation between the pad area and devices. Further plasma processing steps may be completed without accumulating charge and causing the antenna effect. Vias 102 are patterned by lithography and etching through insulating layer 104, and the third metal layer 106 deposited and patterned to re-connect the first metal layer 18 and re-establish the electrical connection from pad to devices. Finally, a passivation layer 108 is deposited on the third layer metal.

Figure 5:
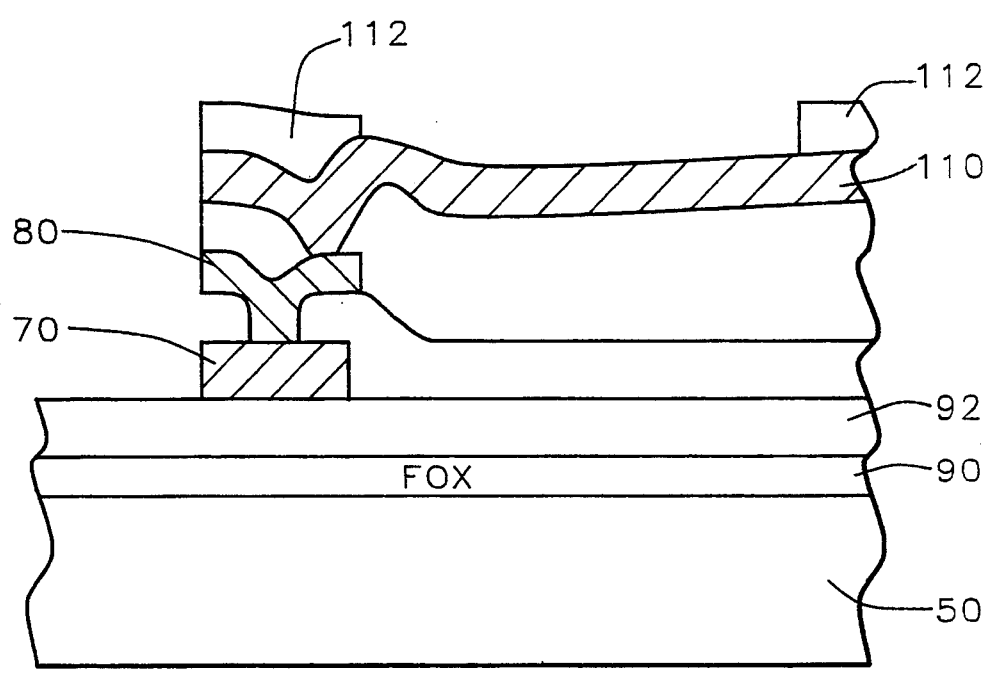

Referring now to FIG. 5, there is shown a cross-sectional representation of the formation of a contact pad in a three-metal technology. Field oxide 90 is grown on substrate 50, and BPSG insulating layer 92 deposited on FOX 90. First metal layer 70 is deposited to be a much reduced area compared to the large contact pad area. This smaller area minimizes charge accumulation during subsequent plasma processing steps. Second metal layer 80 is deposited and patterned to be the same size as first metal layer 70, and connected to first metal layer 70. Further plasma processing may take place with minimal charge accumulation. Third metal layer 110 is deposited and connected to second metal layer 80, and comprises the complete pad area. Passivation layer 112 is deposited above third metal layer 110.

While the invention has been particularly shown and described with reference to the preferred embodiments thereof, it will be understood by those skilled in the art that various changes in form and details may be made without departing from the spirit and scope of the invention.

What is claimed is:

1. A method of forming a multi-level conductive interconnection for an integrated circuit on a silicon substrate, wherein there are contact pad areas at the periphery of said interconnection, comprising:

forming a patterned layer of conductive polysilicon on said substrate to act as a first conductive contact to said integrated circuit;

forming an insulating layer over said polysilicon layer; forming openings to said polysilicon layer through said insulating layer;

forming a first layer of metal on said insulating layer such that said metal electrically connects to said polysilicon through said openings;

forming said contact pad areas with said first layer of metal;

patterning said first layer of metal to form an electrical break in said first metal interconnection, between said contact pad areas and said integrated circuit, wherein said electrical break electrically isolates said contact pad and said integrated circuit to prevent charge build-up during subsequent processing;

further processing in a plasma environment that would normally produce electrical charge build-up at a gate oxide of said integrated circuit, but wherein said electrical break prevents said normally produced electrical charge build-up;

forming and patterning a second insulating layer to form openings for vias to said first metal layer;

forming a second layer of metal over said contact pad areas and over said electrical break such that said second metal electrically connects to said first metal, via direct contact to said first metal at said contact pad areas and through said openings in said second insulating layer to said first metal interconnection, thereby re-connecting said contact pad areas and said integrated circuit; and forming a passivation layer over said second metal layer.

2. The method of claim 1 wherein said further processing in a plasma environment is plasma enhanced chemical vapor deposition.

3. The method of claim 1 wherein said further processing in a plasma environment is plasma etching.

4. The method of claim 3 wherein said plasma etching is a sputter etch.

5. The method of claim 1 wherein the size of said contact pad areas is greater than about 30×30 micrometers.

6. The method of claim 1 wherein said contact pad areas are located at the periphery of said integrated circuit.

7. The method of claim 1 further comprising:

patterning said second metal layer at said electrical break to form a second electrical break;

further processing in a plasma environment that would normally produce electrical charge build-up at a gate oxide of said integrated circuit, but wherein said second electrical break prevents said charge build-up;

forming and patterning a third insulating layer to form openings for vias to said second metal layer;

forming a third layer of metal over said contact pad area and over said second electrical break such that said third metal electrically connects to said second metal, via direct contact to said second metal at said contact pad area and through said openings in said third insulating layer to said second metal interconnection at said second electrical break, thereby re-connecting said contact pad area and said integrated circuit; and forming a passivation layer over said third metal layer.

8. A method of subjecting an integrated circuit, having first metal regions on its surfaces which are electrically connected to device structures, to a plasma process comprising:

electrically breaking said electrical connection to said device structures, thereby isolating said first metal regions from said device structures;

placing said integrated circuit in a chamber for accomplishing said plasma process;

subjecting said integrated circuit to said plasma process wherein said electrically breaking said electrical connection prevents damage to said device structures;

removing said integrated circuit from said chamber; and reconnecting said first metal regions to said structures by means of a second metal layer.

9. The method of claim 8 wherein the size of said first metal regions is greater that about 30×30 micrometers.

10. The method of claim 8 wherein said first metal regions are comprised of contact pads located at the periphery of said integrated circuit.

11. The method of claim 8 wherein said second metal layer and said first metal regions are separated by an insulating material, through which via holes are formed to re-connect said first metal regions to said device structures.

* * * * *